United States Patent
Kuwajima et al.

(10) Patent No.: US 7,652,349 B2
(45) Date of Patent: Jan. 26, 2010

(54) THIN-FILM DEVICE AND METHOD OF MANUFACTURING SAME

(75) Inventors: Hajime Kuwajima, Tokyo (JP); Masahiro Miyazaki, Tokyo (JP); Akira Furuya, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/583,074

(22) Filed: Oct. 19, 2006

(65) Prior Publication Data

US 2007/0108553 A1   May 17, 2007

(30) Foreign Application Priority Data

Nov. 11, 2005   (JP) ............... 2005-327643

(51) Int. Cl.
  *H01L 29/41*   (2006.01)
(52) U.S. Cl. ............... 257/532; 257/E21.016; 257/E29.342; 438/396
(58) Field of Classification Search .......... 257/532, 257/534, E21.016, E27.048, E29.342, E29.343, 257/E29.345; 438/396
See application file for complete search history.

(56) References Cited

U.S. PATENT DOCUMENTS 6,064,108 A * 5/2000 Martinez ................. 257/532
6,891,248 B2 * 5/2005 Akram et al. ........... 257/532
2004/0195567 A1 * 10/2004 Ogino et al. ............ 257/59

FOREIGN PATENT DOCUMENTS

| JP | A 63-10513 | 1/1988 |
| JP | A-6-89831 | 3/1994 |
| JP | A 9-312457 | 12/1997 |
| JP | A-2002-43530 | 2/2002 |
| JP | A 2003-17366 | 1/2003 |
| JP | A 2003-347155 | 12/2003 |

* cited by examiner

*Primary Examiner*—Minh-Loan T Tran
*Assistant Examiner*—W. Wendy Kuo
(74) *Attorney, Agent, or Firm*—Oliff & Berridge, PLC

(57) ABSTRACT

A thin-film device comprises a substrate and a capacitor provided on the substrate. The capacitor incorporates: a lower conductor layer; a dielectric film a portion of which is disposed on the lower conductor layer; and an upper conductor layer disposed on the dielectric film. The lower conductor layer has a top surface, a side surface, and a corner portion formed by the top and side surfaces. The upper conductor layer incorporates an upper electrode portion having a bottom surface opposed to the top surface of the lower conductor layer with the dielectric film disposed in between. When seen from above the upper conductor layer, the periphery of the bottom surface of the upper electrode portion is located inside the periphery of the top surface of the lower conductor layer without touching the periphery of the top surface of the lower conductor layer.

4 Claims, 7 Drawing Sheets

THIN-FILM DEVICE AND METHOD OF MANUFACTURING SAME

BACKGROUND OF THE INVENTION

1. Field of the Invention

The present invention relates to a thin-film device comprising a capacitor and a method of manufacturing such a thin-film device.

2. Description of the Related Art

With increasing demands for reductions in dimensions and thickness of high frequency electronic apparatuses such as cellular phones, reductions in dimensions and profile of electronic components mounted on the high frequency electronic apparatuses have been sought. Some of the electronic components comprise capacitors. Each capacitor typically incorporates a dielectric layer and a pair of conductor layers disposed to sandwich the dielectric layer.

To achieve reductions in dimensions and profile of an electronic component comprising a capacitor, important factors are a reduction in area of a region in which the pair of conductor layers are opposed to each other with the dielectric layer disposed in between and a reduction in the number of layers making up the capacitor. Basically, in prior art, a material having a high permittivity is used as a dielectric material forming the dielectric layer and the thickness of the dielectric layer is reduced to achieve a reduction in area of the above-mentioned region and a reduction in the number of the layers making up the capacitor.

As conventional electronic components comprising capacitors, a thin-film capacitor as disclosed in each of Japanese Published Patent Application (hereinafter referred to as 'JP-A') 2003-347155, JP-A 2003-17366, and JP-A63-10513 is known. This thin-film capacitor incorporates a lower electrode layer, a dielectric layer and an upper electrode layer formed one by one on a substrate through the use of thin-film forming techniques. An electronic component formed through thin-film forming techniques such as this thin-film capacitor is called a thin-film device in the present patent application.

JP-A 9-312457 discloses a circuit board including capacitative elements formed through thin-film forming techniques.

If a thin-film device comprising a capacitor has such a structure that an upper electrode layer is opposed to a corner portion formed by the top surface and a side surface of a lower electrode layer, a dielectric layer being disposed between the upper electrode layer and the corner portion, the thickness of a portion of the dielectric layer near the corner portion is likely to be smaller than the thickness of a portion of the dielectric layer located on the top surface of the lower electrode layer. As a result, the thin-film device having such a structure has a problem that a short-circuit failure and a reduction in withstand voltage of the capacitor are likely to occur.

As a method of solving this problem, JP-A 2003-17366 discloses a method in which an end of the lower electrode layer is formed to be a tapered surface, and a method in which the top surface of the lower electrode layer and that of an insulating layer disposed around the lower electrode layer are flattened to form the dielectric layer and the upper electrode layer one by one on the flattened top surfaces.

JP-A 63-10513 discloses such a technique that a metal film for conduction is formed above the lower electrode layer with the dielectric layer disposed between the lower conductor layer and the metal film, and the upper electrode layer is formed on the metal film by selective plating. In addition, to prevent the metal film for conduction from being extremely thin or broken in a stepped portion formed on the periphery of the lower electrode layer, this publication discloses forming a plating portion near the stepped portion after the formation of the metal film for conduction, the plating portion being provided for bringing the metal film into a completely conducting state.

To prevent a short-circuit between lower and upper electrode layers resulting from a reduction in thickness of a portion of a dielectric layer near the corner portion formed by the top surface and the side surface of the lower electrode layer, JP-A 9-312457 discloses such a technique that the upper electrode layer is formed after a resin insulator is formed on a portion of the dielectric layer near the corner portion.

In the thin-film device comprising a capacitor, the dielectric layer is formed through thin-film forming techniques, so that it is possible to reduce the thickness of the dielectric layer and to thereby reduce the profile of the thin-film device.

In the thin-film device comprising a capacitor, the area of a region in which the lower conductor layer and the upper conductor layer are opposed to each other with the dielectric layer disposed in between is one of parameters for determining the capacitance. Therefore, if the thin-film device has such a structure that the area of the above-mentioned region changes in response to a change in relative positional relationship between the lower and upper electrode layers, there arises a problem that a change in relative positional relationship between the lower and upper electrode layers occurring in the course of manufacture of the thin-film device results in a change in capacitance.

In the thin-film device comprising a capacitor, if the positional relationship between the lower and upper electrode layers is predetermined such that the periphery of the top surface of the lower electrode layer and the periphery of the bottom surface of the upper electrode layer touch each other when seen from above the upper electrode layer, there is a problem as described below, in addition to the above-described problem that the capacitance changes in response to a change in relative positional relationship between the lower and upper electrode layers. In this case, if the relative positional relationship between the lower and upper electrode layers changes in the course of manufacture of the thin-film device, there occurs a case in which the periphery of the bottom surface of the upper electrode layer is located outside or inside the periphery of the top surface of the lower electrode layer. Consequently, there is a possibility that the upper electrode layer is opposed to or not opposed to the corner portion formed by the top surface and the side surface of the lower electrode layer, the dielectric layer being disposed between the corner portion and the upper electrode layer. Here, if the upper electrode layer is opposed to the corner portion formed by the top surface and the side surface of the lower electrode layer, the dielectric layer being disposed between the corner portion and the upper electrode layer, it is likely that a short-circuit failure and a reduction in withstand voltage of the capacitor occur as mentioned above. Therefore, there arises a problem that variations in characteristics of the capacitor increase in response to a change in relative positional relationship between the lower and upper electrode layers when the positional relationship between the lower and upper electrode layers is predetermined such that the periphery of the top surface of the lower electrode layer and the periphery of the bottom surface of the upper electrode layer touch each other when seen from above the upper electrode layer.

OBJECT AND SUMMARY OF THE INVENTION

It is an object of the invention to provide a thin-film device comprising a capacitor, the thin-film device being capable of suppressing variations in characteristics of the capacitor resulting from variations in relative positional relationship between a pair of conductor layers making up a pair of electrodes of the capacitor, and to provide a method of manufacturing such a thin-film device.

A first thin-film device of the invention comprises a capacitor. The capacitor incorporates: a lower conductor layer; a dielectric film a portion of which is disposed on the lower conductor layer; and an upper conductor layer disposed on the dielectric film. The lower conductor layer has a top surface, a side surface, and a corner portion formed by the top surface and the side surface. In the corner portion, an angle formed between the top surface of the lower conductor layer and the side surface of the lower conductor layer is an obtuse angle. The dielectric film has a thickness smaller than the thickness of the lower conductor layer, and touches the top surface, the side surface and the corner portion of the lower conductor layer. The upper conductor layer incorporates: an upper electrode portion that has a bottom surface opposed to the top surface of the lower conductor layer with the dielectric film disposed in between and that functions as one of electrodes of the capacitor; and a transmission line portion that extends from the upper electrode portion to a side thereof, that has a bottom surface opposed to the top surface, the side surface and the corner portion of the lower conductor layer with the dielectric film disposed in between, and that functions as a signal transmission line. The transmission line portion has a width that is smaller than the width of the upper electrode portion. When seen from above the upper conductor layer, the periphery of the bottom surface of the upper electrode portion is located inside the periphery of the top surface of the lower conductor layer without touching the periphery of the top surface of the lower conductor layer.

According to the first thin-film device of the invention, when seen from above the upper conductor layer, the periphery of the bottom surface of the upper electrode portion is located inside the periphery of the top surface of the lower conductor layer without touching the periphery of the top surface of the lower conductor layer. As a result, the area of the region in which the lower conductor layer and the upper electrode portion are opposed to each other with the dielectric film disposed in between will not change even if there is a certain variation in relative positional relationship between the lower conductor layer and the upper electrode portion.

A second thin-film device of the invention comprises a capacitor. The capacitor incorporates: a lower conductor layer; a dielectric film a portion of which is disposed on the lower conductor layer; and an upper conductor layer disposed on the dielectric film. The lower conductor layer incorporates a lower electrode portion that functions as one of electrodes of the capacitor. The lower electrode portion has a top surface, a side surface, and a corner portion formed by the top surface and the side surface. In the corner portion, an angle formed between the top surface of the lower electrode portion and the side surface of the lower electrode portion is an obtuse angle. The dielectric film has a thickness smaller than the thickness of the lower electrode portion, and touches the top surface, the side surface and the corner portion of the lower electrode portion. The upper conductor layer has a bottom surface opposed to the top surface, the side surface and the corner portion of the lower electrode portion with the dielectric film disposed in between. When seen from above the upper conductor layer, the periphery of the top surface of the lower electrode portion is located inside the periphery of the bottom surface of the upper conductor layer without touching the periphery of the bottom surface of the upper conductor layer.

According to the second thin-film device of the invention, when seen from above the upper conductor layer, the periphery of the top surface of the lower electrode portion is located inside the periphery of the bottom surface of the upper conductor layer without touching the periphery of the bottom surface of the upper conductor layer. As a result, the area of the region in which the lower electrode portion and the upper conductor layer are opposed to each other with the dielectric film disposed in between will not change even if there is a certain variation in relative positional relationship between the lower electrode portion and the upper conductor layer.

In the first or second thin-film device of the invention, the thickness of the dielectric film may fall within a range of 0.02 to 1 μm inclusive.

A method of manufacturing the first thin-film device of the invention comprises the steps of: forming the lower conductor layer so that, in the corner portion of the lower conductor layer, an angle formed between the top surface of the lower conductor layer and the side surface of the lower conductor layer is an obtuse angle; forming the dielectric film; and forming the upper conductor layer.

According to the method of manufacturing the first thin-film device of the invention, when seen from above the upper conductor layer, the periphery of the bottom surface of the upper electrode portion is located inside the periphery of the top surface of the lower conductor layer without touching the periphery of the top surface of the lower conductor layer. As a result, the area of the region in which the lower conductor layer and the upper electrode portion are opposed to each other with the dielectric film disposed in between will not change even if there is a certain variation in relative positional relationship between the lower conductor layer and the upper electrode portion.

A method of manufacturing the second thin-film device of the invention comprises the steps of: forming the lower conductor layer so that, in the corner portion of the lower electrode portion, an angle formed between the top surface of the lower electrode portion and the side surface of the lower electrode portion is an obtuse angle; forming the dielectric film; and forming the upper conductor layer.

According to the method of manufacturing the second thin-film device of the invention, when seen from above the upper conductor layer, the periphery of the top surface of the lower electrode portion is located inside the periphery of the bottom surface of the upper conductor layer without touching the periphery of the bottom surface of the upper conductor layer. As a result, the area of the region in which the lower electrode portion and the upper conductor layer are opposed to each other with the dielectric film disposed in between will not change even if there is a certain variation in relative positional relationship between the lower electrode portion and the upper conductor layer.

In the method of manufacturing the first or second thin-film device of the invention, the thickness of the dielectric film may fall within a range of 0.02 to 1 μm inclusive.

According to the first thin-film device or the method of manufacturing the same of the invention, when seen from above the upper conductor layer, the periphery of the bottom surface of the upper electrode portion is located inside the periphery of the top surface of the lower conductor layer without touching the periphery of the top surface of the lower conductor layer. As a result, the area of the region in which the lower conductor layer and the upper electrode portion are opposed to each other with the dielectric film disposed in between will not change even if there is a certain variation in relative positional relationship between the lower conductor layer and the upper electrode portion. Consequently, according to the invention, it is possible to suppress variations in characteristics of the capacitor resulting from variations in relative positional relationship between the pair of conductor layers making up the pair of electrodes of the capacitor.

According to the second thin-film device or the method of manufacturing the same of the invention, when seen from above the upper conductor layer, the periphery of the top surface of the lower electrode portion is located inside the periphery of the bottom surface of the upper conductor layer without touching the periphery of the bottom surface of the upper conductor layer. As a result, the area of the region in which the lower electrode portion and the upper conductor layer are opposed to each other with the dielectric film disposed in between will not change even if there is a certain variation in relative positional relationship between the lower electrode portion and the upper conductor layer. Consequently, according to the invention, it is possible to suppress variations in characteristics of the capacitor resulting from variations in relative positional relationship between the pair of conductor layers making up the pair of electrodes of the capacitor.

Other and further objects, features and advantages of the invention will appear more fully from the following description.

DESCRIPTION OF PREFERRED EMBODIMENTS

Preferred embodiments of the invention will now be described with reference to the accompanying drawings.

First Embodiment

Figure 1:
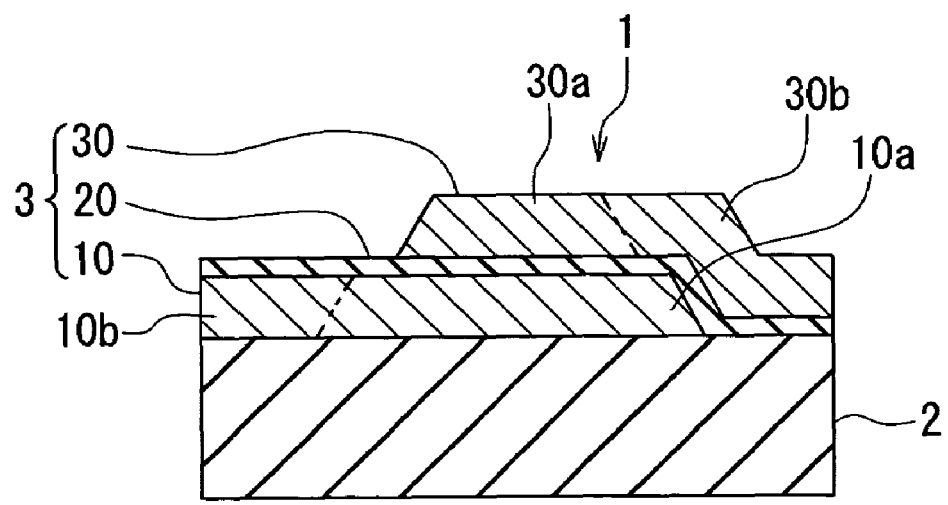
FIG. 1 is a cross-sectional view of a thin-film device of a first embodiment of the invention.
Figure 2:
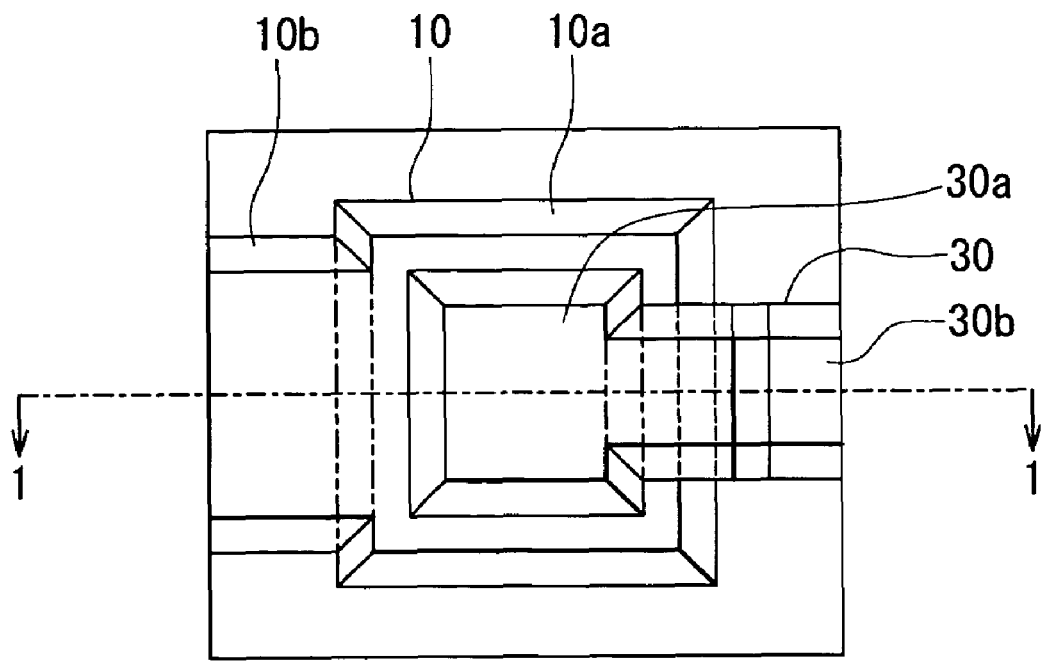
FIG. 2 is a top view of the thin-film device of the first embodiment of the invention.

Reference is now made to FIG. 1 and FIG. 2 to describe a thin-film device of a first embodiment of the invention. FIG. 2 is a top view of the thin-film device of the embodiment. FIG. 1 is a cross-sectional view taken along line 1-1 of FIG. 2. As shown in FIG. 1, the thin-film device 1 of the embodiment comprises a substrate 2 and a capacitor 3 provided on the substrate 2. The capacitor 3 incorporates: a lower conductor layer 10 disposed on the substrate 2; a dielectric film 20 a portion of which is disposed on the lower conductor layer 10; and an upper conductor layer 30 disposed on the dielectric film 20.

The lower conductor layer 10 incorporates: a lower electrode portion 10a that functions as one of electrodes of the capacitor 3; and a lower transmission line portion 10b that extends from the lower electrode portion 10a to a side thereof and functions as a signal transmission line. The lower conductor layer 10 has a top surface, a side surface, and a corner portion formed by the top surface and the side surface. In the corner portion of the lower conductor layer 10, the angle formed by the top surface and the side surface of the lower conductor layer 10 is an obtuse one.

The upper conductor layer 30 incorporates: an upper electrode portion 30a that functions as the other one of the electrodes of the capacitor 3; and an upper transmission line portion 30b that extends from the upper electrode portion 30a to a side thereof and functions as a signal transmission line. The upper electrode portion 30a has a bottom surface opposed to the top surface of the lower conductor layer 10 with the dielectric film 20 disposed in between. The upper transmission line portion 30b has a bottom surface opposed to the top surface, the side surface and the corner portion of the lower conductor layer 10 with the dielectric film 20 disposed in between.

Each of the lower electrode portion 10a and the upper electrode portion 30a is quadrangular-prismoid-shaped, for example. When seen from above the upper conductor layer 30, the periphery of the bottom surface of the upper electrode portion 30a is located inside the periphery of the top surface of the lower conductor layer 10 without touching the periphery of the top surface of the lower conductor layer 10. The width of the lower transmission line portion 10b is smaller than that of the lower electrode portion 10a. The width of the upper transmission line portion 30b is smaller than that of the upper electrode portion 30a. Here, the width of each of the transmission line portions 10b and 30b means the length of each of the transmission line portions 10b and 30b taken in the direction orthogonal to the direction along which each of the transmission line portions 10b and 30b extends.

The dielectric film 20 is disposed to cover the top surface and the side surface of the lower conductor layer 10 and the top surface of the substrate 2, and touches the top surface, the side surface and the corner portion of the lower conductor layer 10. The dielectric film 20 has a thickness smaller than that of the lower conductor layer 10.

The substrate 2 is made of an insulating material (a dielectric material). The insulating material forming the substrate 2 may be an inorganic material or an organic material. The insulating material forming the substrate 2 may be $Al_2O_3$, for example.

The lower conductor layer 10 and the upper conductor layer 30 are made of a conductive material such as Cu. The dielectric film 20 is made of a dielectric material. The dielectric material forming the dielectric film 20 is preferably an inorganic material. The dielectric material forming the dielectric film 20 may be any of $Al_2O_3$, $Si_4N_3$ and $SiO_2$, for example.

The thickness of the dielectric film 20 preferably falls within a range of 0.02 to 1 μm inclusive, and more preferably a range of 0.05 to 0.5 μm inclusive. The thickness of the lower conductor layer 10 preferably falls within a range of 5 to 10 μm inclusive. The thickness of the upper conductor layer 30 preferably falls within a range of 5 to 10 μm inclusive.

The reason why it is preferred that the thicknesses of the lower conductor layer 10 and the upper conductor layer 30 fall within the above-mentioned ranges will now be described. The thin-film device of the embodiment is used in a band-pass filter for a wireless local area network (LAN) or for a cellular phone. For the wireless LAN a frequency band of 2.5 GHz is used. Considering the passing loss in this frequency band, it is required that the thickness of each of the lower conductor layer 10 and the upper conductor layer 30 be 3 μm or greater. That is, if the thickness of each of the lower conductor layer 10 and the upper conductor layer 30 is smaller than 3 μm, the passing loss will be too great. In addition, a frequency band of 800 MHz to 1.95 GHz is used for cellular phones. To improve the attenuation characteristic of the band-pass filter and to suppress noise at low frequencies in this frequency band in particular, it is required that the thickness of each of the lower conductor layer 10 and the upper conductor layer 30 be 5 μm or greater. Therefore, it is preferred that the thickness of each of the lower conductor layer 10 and the upper conductor layer 30 be 5 μm or greater. On the other hand, if each of the lower conductor layer 10 and the upper conductor layer 30 is too thick, the surface roughness of the top surface of each of the lower conductor layer 10 and the upper conductor layer 30 is increased and the skin resistance of each of the lower conductor layer 10 and the upper conductor layer 30 is thereby increased, or it becomes necessary to perform flattening processing for reducing the surface roughness of the top surface of each of the lower conductor layer 10 and the upper conductor layer 30, which requires time and labor. Therefore, it is practically preferred that the thickness of each of the lower conductor layer 10 and the upper conductor layer 30 be 10 μm or smaller.

In the embodiment it is preferred that the surface roughness in maximum height Rz of the top surface of the lower conductor layer 10 be equal to or smaller than the thickness of the dielectric film 20. The surface roughness in maximum height Rz is one of parameters indicating the surface roughness and is defined as a sum of the maximum value of the peak and the maximum value of the valley of a contour curve of a unit length.

Reference is now made to FIG. 3 to FIG. 10 to describe a method of manufacturing the thin-film device 1 of the embodiment. Although examples of materials and thicknesses of the layers are given in the following description, those examples are non-limiting for the method of the embodiment.

Figure 3:
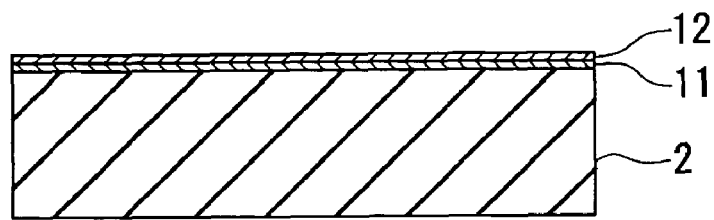
FIG. 3 is a cross-sectional view illustrating a step of a method of manufacturing the thin-film device of the first embodiment of the invention.

FIG. 3 is a cross-sectional view illustrating a step of the method of manufacturing the thin-film device 1 of the embodiment. In the method, first, as shown in FIG. 3, a first electrode film 11 and a second electrode film 12 are formed one by one on the substrate 2 by sputtering, for example. The electrode films 11 and 12 will be used as electrodes when a plating film is formed by electroplating later and will make up part of the lower conductor layer 10. The material of the first electrode film 11 is Ti, for example. The thickness of the first electrode film 11 is 5 nm, for example. The material of the second electrode film 12 is Cu or Ni, for example. The thickness of the second electrode film 12 is 100 nm, for example. Alternatively, a single-layer electrode film may be formed in place of the electrode films 11 and 12.

Figure 4:
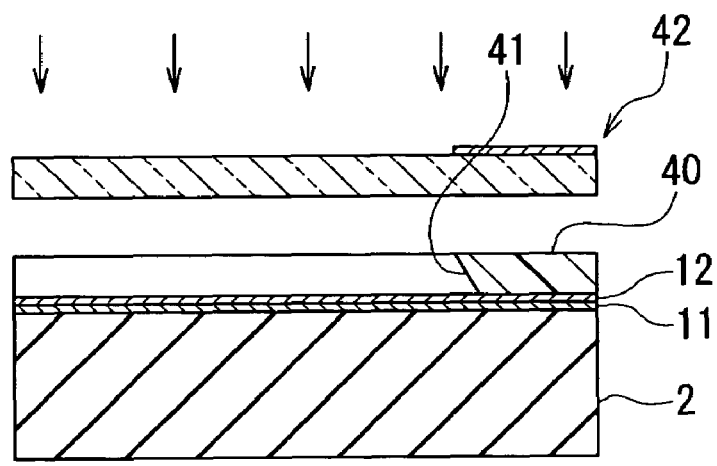
FIG. 4 is a cross-sectional view illustrating a step that follows the step of FIG. 3.

FIG. 4 illustrates the following step. In the step, first, a positive photoresist layer having a thickness of 8 μm, for example, is formed on the electrode film 12. Next, the positive photoresist layer is patterned by photolithography using a photomask 42 to form a frame 40. The frame 40 has a groove 41 having a shape corresponding to the shape of the lower conductor layer 10 to be formed, that is, the shape that increases in width as the distance from the substrate 2 decreases. Because of this shape of the groove 41 of the frame 40, the angle formed between the top surface and the side surface of the plating film 13 is made an obtuse angle in the corner portion formed by the top surface and the side surface of the plating film 13 that will be described later.

Figure 5:
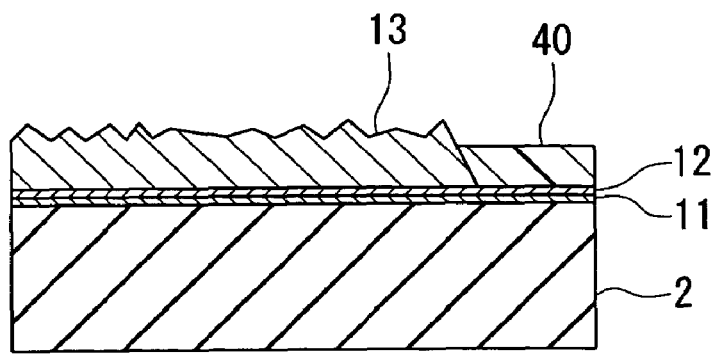
FIG. 5 is a cross-sectional view illustrating a step that follows the step of FIG. 4.

Next, as shown in FIG. 5, the plating film 13 is formed in the groove 41 by electroplating using the electrode films 11 and 12 as electrodes. The material of the plating film 13 is Cu, for example. The thickness of the plating film 13 is 9 to 10 μm, for example.

Figure 6:
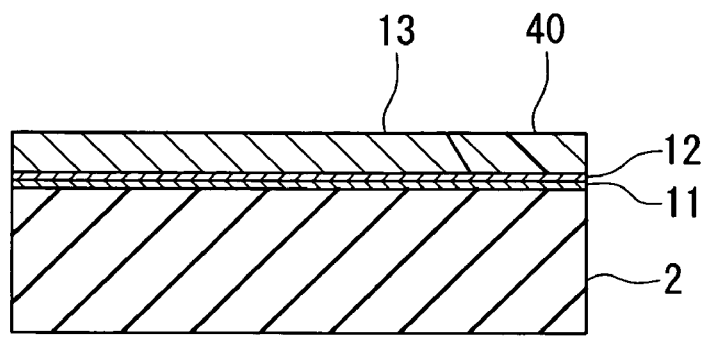
FIG. 6 is a cross-sectional view illustrating a step that follows the step of FIG. 5.

Next, as shown in FIG. 6, the top surface of the plating film 13 is flattened. In this step it is preferred that the surface roughness in maximum height Rz of the top surface of the plating film 13 be made equal to or smaller than the thickness of the dielectric film 20 that will be formed later. For example, when the dielectric film 20 having a thickness of 0.1 μm is to be made, it is preferred that the top surface of the plating film 13 be flattened so that the surface roughness in maximum height Rz of the top surface of the plating film 13 is equal to or smaller than 0.1 μm.

The flattening processing of the embodiment is performed by polishing the top surface of the plating film 13. A method of this polishing is chemical mechanical polishing (CMP), for example. The polishing is performed such that the thickness of the plating film 13 flattened is 8 μm, for example. The method of polishing the top surface of the plating film 13 is not limited to CMP but may be any other polishing method such as buffing, lapping and die polishing. The processing of flattening the top surface of the plating film 13 may be performed by a combination of two or more polishing methods. It is not necessary to flatten the top surface of the plating film 13 by polishing in such a case that the surface roughness in maximum height Rz of the top surface of the plating film 13 is sufficiently small without flattening the top surface of the plating film 13.

In the step shown in FIG. 5, if the plating film 13 is formed so that the thickness of the plating film 13 is greater than the thickness of the frame 40, portions of the plating film 13 out of the groove 41 of the frame 40 may be polished, and polishing may be stopped when the thickness of the plating film 13 coincides with that of the frame 40 in the step shown in FIG. 6. In this case, it is possible to precisely control the thickness of the lower conductor layer 10 formed of the plating film 13. Furthermore, if the amount of polishing of the frame 40 is great, the polishing device such as a grindstone may be loaded, and flattening of the top surface of the plating film 13 may be thereby disturbed. Such a failure can be prevented if the polishing is stopped when the thickness of the plating film 13 coincides with that of the frame 40.

Figure 7:
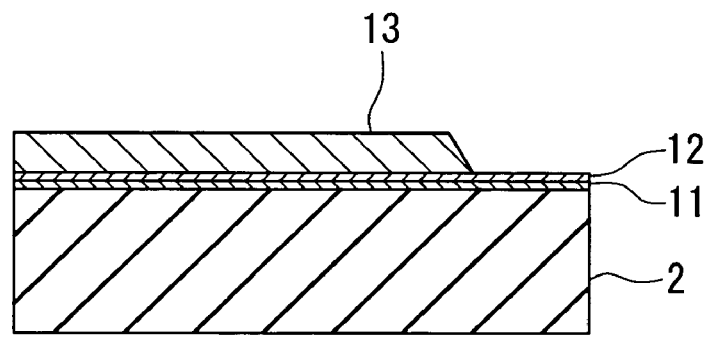
FIG. 7 is a cross-sectional view illustrating a step that follows the step of FIG. 6.
Figure 8:
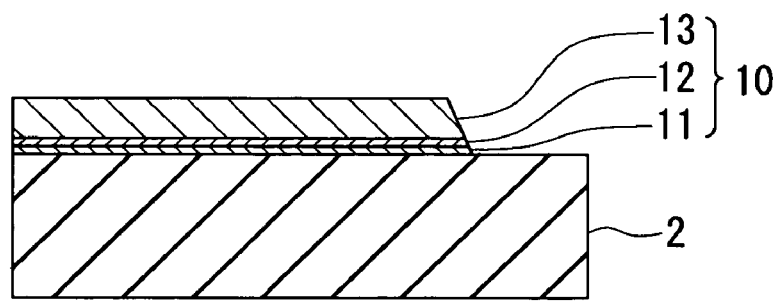
FIG. 8 is a cross-sectional view illustrating a step that follows the step of FIG. 7.

Next, as shown in FIG. 7, the frame 40 is removed. Next, as shown in FIG. 8, the electrode films 11 and 12 except portions thereof located below the plating film 13 are removed by dry etching or wet etching. As a result, the lower conductor layer 10 is formed of the remaining electrode films 11 and 12 and the plating film 13. If the material of each of the electrode film 12 and the plating film 13 is Cu, a portion of the plating film 13 is etched, too, when etching is performed to remove the electrode films 11 and 12. However, there is hardly any difference between the surface roughness of the top surface of the plating film 13 before this etching and that after this etching. If the material of the electrode film 12 is Ni and the material of the plating film 13 is Cu, a condition under which the plating film 13 is not etched is chosen for the etching for removing the electrode films 11 and 12. Since flattening processing is performed on the top surface of the plating film 13 in the step shown in FIG. 6, the top surface of the lower conductor layer 10 formed in the step shown in FIG. 8 is flattened. Because of the shape of the groove 41 of the frame 40, the angle formed between the top surface and the side surface of the lower conductor layer 10 is made an obtuse angle in the corner portion formed by the top surface and the side surface of the lower conductor layer 10.

Figure 9:
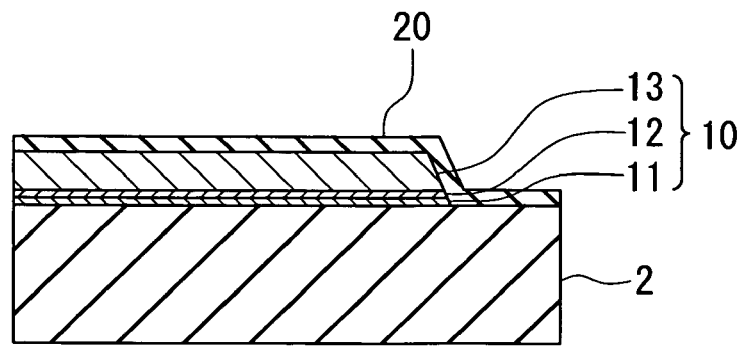
FIG. 9 is a cross-sectional view illustrating a step that follows the step of FIG. 8.

Next, as shown in FIG. 9, the dielectric film 20 is formed by sputtering, for example, to cover the top and side surfaces of the lower conductor layer 10 and the top surface of the substrate 2. The thickness of the dielectric film 20 is 0.1 µm, for example.

Figure 10:
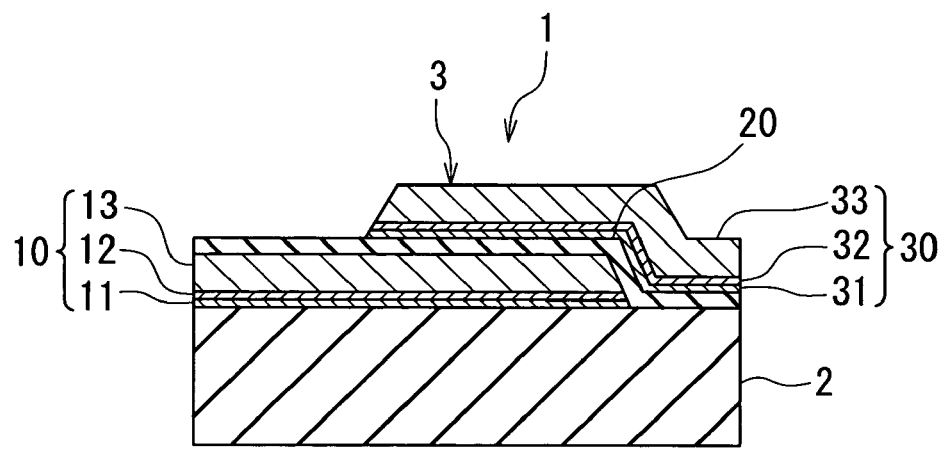
FIG. 10 is a cross-sectional view illustrating a step that follows the step of FIG. 9.

Next, as shown in FIG. 10, the upper conductor layer 30 is formed in a region that is on the dielectric film 20 and that is opposed to the top surface and the side surface of the lower conductor layer 10 and the top surface of the substrate 2 with the dielectric film disposed in between. A method of forming the upper conductor layer 30 is the same as that of the lower conductor layer 10 except the flattening processing. That is, electrode films 31 and 32 are first formed in this order on the dielectric film 20. The materials and thicknesses of the electrode films 31 and 32 are the same as those of the electrode films 11 and 12. Next, a positive photoresist layer having a thickness of 8 µm, for example, is formed on the electrode film 32. Next, the positive photoresist layer is patterned by photolithography to form a frame not shown. The frame has a groove having a shape corresponding to the shape of the upper conductor layer 30 to be formed. Next, a plating film 33 is formed in the groove by electroplating using the electrode films 31 and 32 as electrodes. The material of the plating film 33 is Cu, for example. The thickness of the plating film 33 is 8 µm, for example. Next, the frame is removed. Next, the electrode films 31 and 32 except portions thereof located below the plating film 33 are removed by dry etching or wet etching. As a result, the upper conductor layer 30 is formed of the remaining electrode films 31 and 32 and the plating film 33.

In the embodiment, when seen from above the upper conductor layer 30, the periphery of the bottom surface of the upper electrode portion 30a is located inside the periphery of the top surface of the lower conductor layer 10 without touching the periphery of the top surface of the lower conductor layer 10. As a result, even if there is a certain variation in relative positional relationship between the lower conductor layer 10 and the upper electrode portion 30a, the area of the region in which the lower conductor layer 10 and the upper electrode portion 30a are opposed to each other with the dielectric film 20 disposed in between will not change. To be specific, the area of the region in which the lower conductor layer 10 and the upper electrode portion 30a are opposed to each other with the dielectric film 20 disposed in between is equal to the area of the bottom surface of the upper electrode portion 30a until the periphery of the bottom surface of the upper electrode portion 30a touches the periphery of the top surface of the lower conductor layer 10. Therefore, until the periphery of the bottom surface of the upper electrode portion 30a touches the periphery of the top surface of the lower conductor layer 10, the area of the region in which the lower conductor layer 10 and the upper electrode portion 30a are opposed to each other with the dielectric film 20 disposed in between will not change even if there is a variation in relative positional relationship between the lower conductor layer 10 and the upper electrode portion 30a. The area of the region in which the lower conductor layer 10 and the upper electrode portion 30a are opposed to each other with the dielectric film 20 disposed in between is one of parameters for determining the capacitance of the capacitor 3. Because of the forgoing, according to the embodiment, it is possible to prevent a change in capacitance of the capacitor 3 resulting from a variation in relative positional relationship between the lower conductor layer 10 and the upper conductor layer 30.

In the embodiment, until the periphery of the bottom surface of the upper electrode portion 30a touches the periphery of the top surface of the lower conductor layer 10, the upper electrode portion 30a is not opposed to the corner portion with the dielectric film 20 disposed in between, the corner portion being formed by the top surface and the side surface of the lower conductor layer 10, even if there is a variation in relative positional relationship between the lower conductor layer 10 and the upper electrode portion 30a. That is, such uncertainty is impossible that it depends whether the upper electrode portion 30a is opposed or not opposed to the corner portion of the lower conductor layer 10 with the dielectric film 20 disposed in between. As a result, according to the embodiment, it is possible to prevent changes in characteristics of the capacitor 3 resulting from a variation in relative positional relationship between the lower conductor layer 10 and the upper conductor layer 30.

The foregoing features of the embodiment make it possible to suppress variations in characteristics of the capacitor 3 resulting from a variation in relative positional relationship between the lower conductor layer 10 and the upper conductor layer 30.

According to the embodiment, the angle formed between the top surface and the side surface of the lower conductor layer 10 is an obtuse angle in the corner portion formed by the top surface and the side surface of the lower conductor layer 10. As a result, according to the embodiment, it is possible to prevent a reduction in thickness of the dielectric film 20 in a neighborhood of the corner portion of the lower conductor layer 10. It is thereby possible to suppress a short-circuit failure and a reduction in withstand voltage of the capacitor 3 resulting from the structure in which the upper conductor layer 30 is opposed to the corner portion of the lower conductor layer 10 with the dielectric film 20 disposed in between.

In the method of manufacturing the thin-film device 1 of the embodiment, the lower conductor layer 10 is formed by electroplating. However, the lower conductor layer 10 of the thin-film device 1 of the embodiment may be formed by a method other than electroplating. For example, the lower conductor layer 10 may be formed by physical vapor deposition (PVD) such as sputtering or evaporation. When the lower conductor layer 10 is formed by electroplating, it is preferred to adjust the sizes of precipitation grains by controlling the composition of plating bath and the current density. In addition, when the lower conductor layer 10 is formed by electroplating, it is preferred that, for suppressing a change in the surface roughness of the top surface of the lower conductor layer 10 with time, heat treatment be performed on the lower conductor layer 10 so that the lower conductor layer 10 is in equilibrium and then the dielectric film 20 be formed on the lower conductor layer 10. When the lower conductor layer 10 is formed by PVD, heat treatment of the lower conductor layer 10 is not required since it is nearly in the state of equilibrium.

In the embodiment, inverse sputtering may be performed before forming the dielectric film 20 to remove unwanted substances such as oxides and organic substances present on the surface of the lower conductor layer 10 and to activate the surface of the lower conductor layer 10 so as to improve the contact of the surface of the lower conductor layer 10 with the dielectric film 20. In this case, in particular, processing of improving the contact of the surface of the lower conductor layer 10 with the dielectric film 20 and processing of forming the dielectric film 20 may be performed consecutively in a single vacuum chamber, so that the contact of the lower conductor layer 10 with the dielectric film 20 is further improved.

It is also possible that, before forming the electrode film 11 or 31, inverse sputtering is performed to remove unwanted substances such as oxides and organic substances present on the surface of the base of the electrode film 11 or 31 and to improve the contact of the surface of the base with the electrode film 11 or 31.

In the step of forming the lower conductor layer 10 or the step of forming the upper conductor layer 30, inverse sputtering is employed, for example, as the method of removing the electrode films except the portions thereof located below the plating film. In this case, there is a possibility of damaging the top surface of the lower conductor layer 10, the upper conductor layer 30 or the dielectric film 20, depending on the conditions for the inverse sputtering. Methods for preventing this include removing the electrode films by wet etching, and adjusting the output and duration of inverse sputtering when the electrode films are removed by inverse sputtering. Alternatively, a film of a material (such as Ni) that is not used for the electrode films may be formed by plating, for example, on the plating film made of Cu, for example, and the electrode films may be selectively etched by inverse sputtering. Another alternative is that, a sputter film of Cu may be formed on the plating film made of Cu, for example. In this case, the crystal grain diameter of the sputter film is smaller than that of the plating film, and therefore it is possible to prevent the top surface of the lower conductor layer 10 or the upper conductor layer 30 from being damaged by inverse sputtering.

In the case of performing inverse sputtering after the dielectric film 20 is formed and before the electrode film 31 is formed, and/or in the case of removing the electrode films 31 and 32 by inverse sputtering to form the upper conductor layer 30, it is necessary to adjust the conditions for the inverse sputtering such as the output, gas flow rate, and process time so as to prevent a reduction in thickness of the dielectric film 20 and damage to the dielectric film 20.

Second Embodiment

Figure 11:
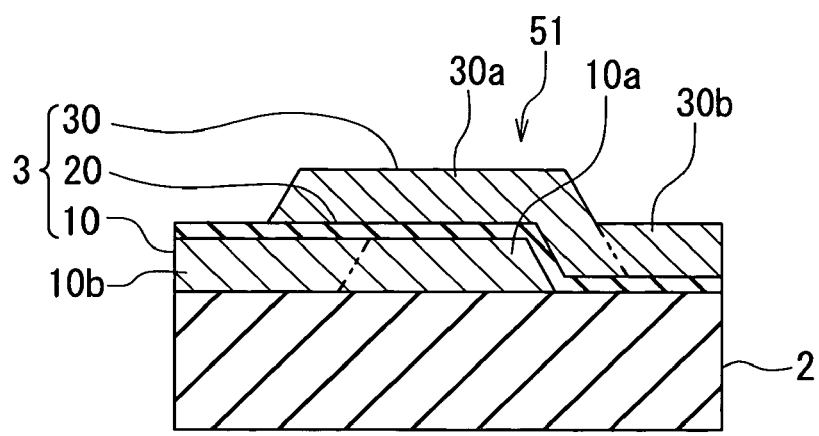
FIG. 11 is a cross-sectional view of a thin-film device of a second embodiment of the invention.
Figure 12:
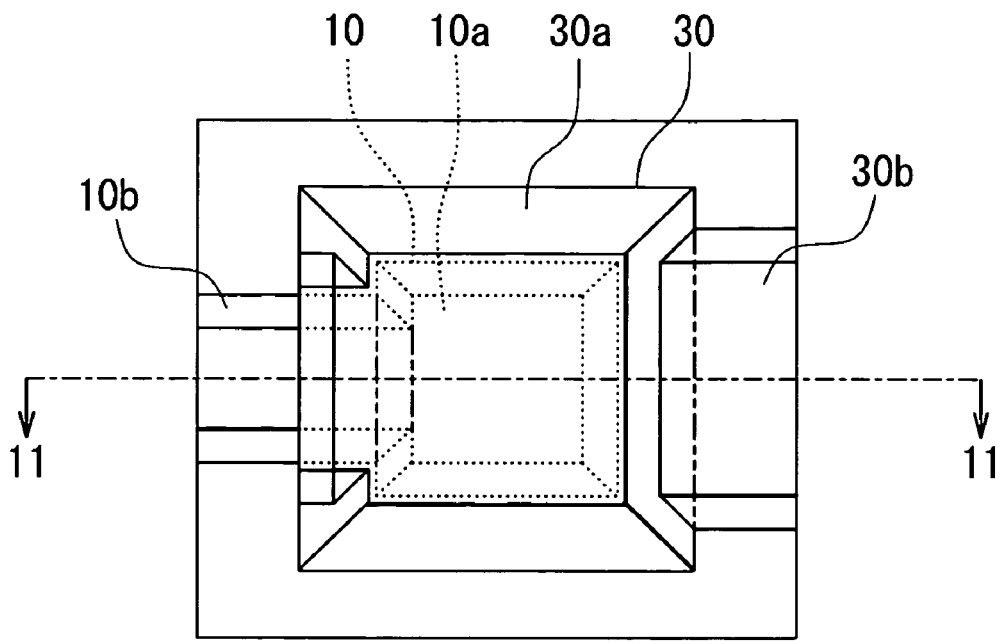
FIG. 12 is a top view of the thin-film device of the second embodiment of the invention.

Reference is now made to FIG. 11 and FIG. 12 to describe a thin-film device of a second embodiment of the invention.

FIG. 12 is a top view of the thin-film device of the embodiment. FIG. 11 is a cross-sectional view taken along line 11-11 of FIG. 12. As shown in FIG. 11, the thin-film device 51 of the second embodiment comprises the substrate 2 and the capacitor 3 provided on the substrate 2. The capacitor 3 incorporates: the lower conductor layer 10 disposed on the substrate 2; the dielectric film 20 a portion of which is disposed on the lower conductor layer 10; and the upper conductor layer 30 disposed on the dielectric film 20.

The lower conductor layer 10 incorporates: the lower electrode portion 10*a* that functions as one of the electrodes of the capacitor 3; and the lower transmission line portion 10*b* that extends from the lower electrode portion 10*a* to a side thereof and functions as a signal transmission line. The lower electrode portion 10*a* has the top surface, the side surface, and the corner portion formed by the top surface and the side surface. In the corner portion of the lower electrode portion 10*a*, the angle formed by the top surface and the side surface of the lower electrode portion 10*a* is an obtuse one.

The upper conductor layer 30 incorporates: the upper electrode portion 30*a* that functions as the other one of the electrodes of the capacitor 3; and the upper transmission line portion 30*b* that extends from the upper electrode portion 30*a* to a side thereof and functions as a signal transmission line. The upper electrode portion 30*a* has the bottom surface opposed to the top surface, the side surface and the corner portion of the lower electrode portion 10*a* with the dielectric film 20 disposed in between. The upper transmission line portion 30*b* has the bottom surface opposed to the substrate 2 with the dielectric film 20 disposed in between.

The lower electrode portion 10*a* is quadrangular-prismoid-shaped, for example. Since the upper electrode portion 30*a* covers the lower electrode portion 10*a*, the upper electrode portion 30*a* has a shape corresponding to the peripheral surface of the lower electrode portion 10*a*. A difference of the thin-film device 51 of the second embodiment from the thin-film device 1 of the first embodiment is that, when seen from above the upper conductor layer 30, the periphery of the top surface of the lower electrode portion 10*a* is located inside the periphery of the bottom surface of the upper conductor layer 30 without touching the periphery of the bottom surface of the upper conductor layer 30. The width of the lower transmission line portion 10*b* is smaller than that of the lower electrode portion 10*a*. The width of the upper transmission line portion 30*b* is smaller than that of the upper electrode portion 30*b*.

The dielectric film 20 is disposed to cover the top surface and the side surface of the lower conductor layer 10 and the top surface of the substrate 2, and touches the top surface, the side surface and the corner portion of the lower electrode portion 10*a*. The dielectric film 20 has a thickness smaller than that of the lower electrode portion 10*a*.

The thickness of the dielectric film 20 preferably falls within a range of 0.02 to 1 μm inclusive, and more preferably a range of 0.05 to 0.5 μm inclusive. The thickness of the lower conductor layer 10 preferably falls within a range of 5 to 10 μm inclusive. The thickness of the upper conductor layer 30 preferably falls within a range of 5 to 10 μm inclusive.

In the embodiment it is preferred that the surface roughness in maximum height Rz of the top surface of the lower conductor layer 10 be equal to or smaller than the thickness of the dielectric film 20.

Reference is now made to. FIG. 13 to FIG. 19 to describe a method of manufacturing the thin-film device 51 of the embodiment. Although examples of materials and thicknesses of the layers are given in the following description, those examples are non-limiting for the method of the embodiment.

The method of manufacturing the thin-film device 51 of the second embodiment includes the steps up to the step of forming the first electrode film 11 and the second electrode film 12 one by one as shown in FIG. 3 that are the same as those of the first embodiment.

Figure 13:
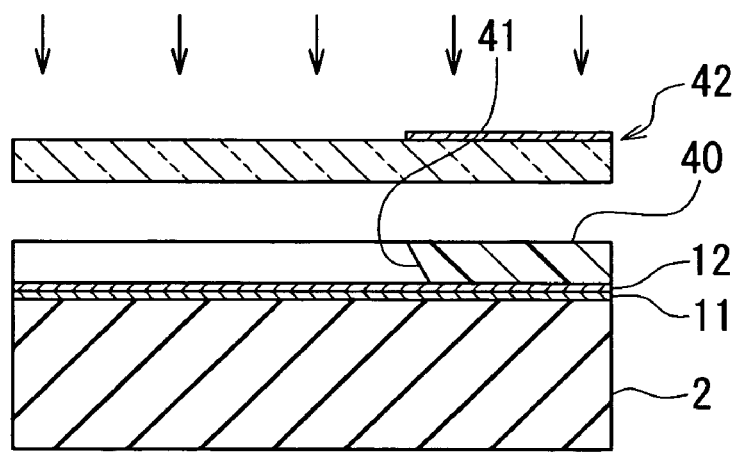
FIG. 13 is a cross-sectional view illustrating a step of a method of manufacturing the thin-film device of the second embodiment of the invention.

FIG. 13 illustrates the following step. In the step, first, a positive photoresist layer having a thickness of 8 μm, for example, is formed on the electrode film 12. Next, the positive photoresist layer is patterned by photolithography using a photomask 42 to form a frame 40. The frame 40 has a groove 41 having a shape corresponding to the shape of the lower conductor layer 10 to be formed, that is, the shape that increases in width as the distance from the substrate 2 decreases. Because of this shape of the groove 41 of the frame 40, the angle formed between the top surface and the side surface of the plating film 13 is made an obtuse angle in the corner portion formed by the top surface and the side surface of the plating film 13 that will be described later.

Figure 14:
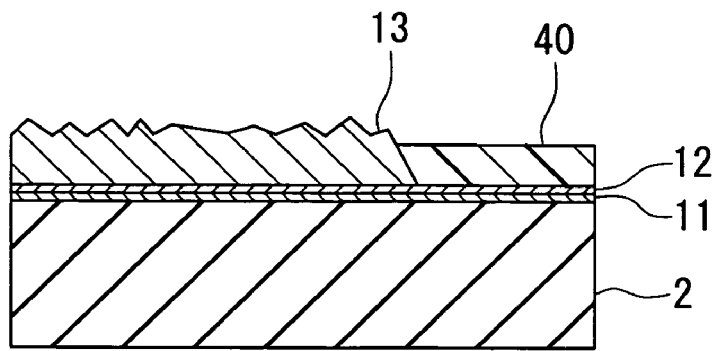
FIG. 14 is a cross-sectional view illustrating a step that follows the step of FIG. 13.

Next, as shown in FIG. 14, the plating film 13 is formed in the groove 41 by electroplating using the electrode films 11 and 12 as electrodes. The material of the plating film 13 is Cu, for example. The thickness of the plating film 13 is 9 to 10 μm, for example.

Figure 15:
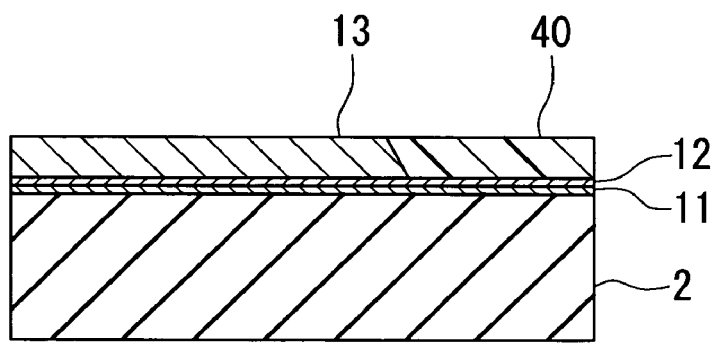
FIG. 15 is a cross-sectional view illustrating a step that follows the step of FIG. 14.

Next, as shown in FIG. 15, the top surface of the plating film 13 is flattened. In this step it is preferred that the surface roughness in maximum height Rz of the top surface of the plating film 13 be made equal to or smaller than the thickness of the dielectric film 20 that will be formed later. For example, when the dielectric film 20 having a thickness of 0.1 μm is to be made, it is preferred that the top surface of the plating film 13 be flattened so that the surface roughness in maximum height Rz of the top surface of the plating film 13 is equal to or smaller than 0.1 μm. The method of polishing the top surface of the plating film 13 is the same as that of the first embodiment.

Figure 16:
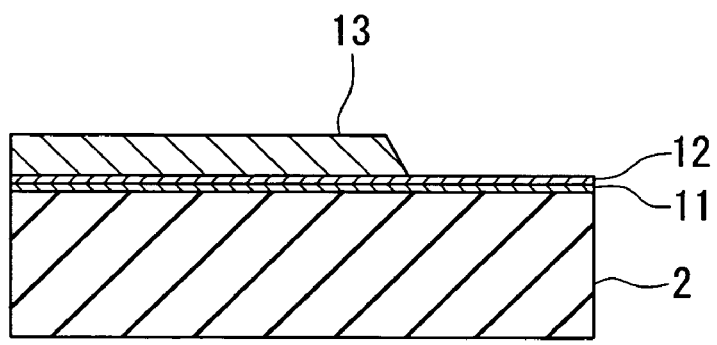
FIG. 16 is a cross-sectional view illustrating a step that follows the step of FIG. 15.
Figure 17:
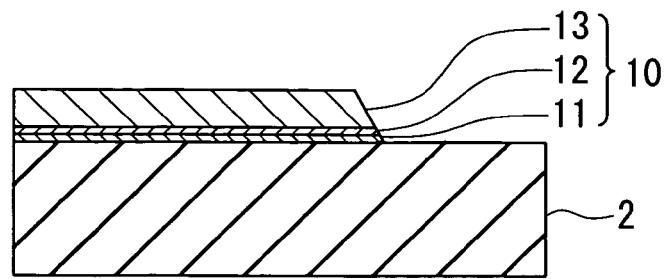
FIG. 17 is a cross-sectional view illustrating a step that follows the step of FIG. 16.

Next, as shown in FIG. 16, the frame 40 is removed. Next, as shown in FIG. 17, the electrode films 11 and 12 except portions thereof located below the plating film 13 are removed by dry etching or wet etching. As a result, the lower conductor layer 10 is formed of the remaining electrode films 11 and 12 and the plating film 13. Since flattening processing is performed on the top surface of the plating film 13 in the step shown in FIG. 15, the top surface of the lower conductor layer 10 formed in the step shown in FIG. 17 is flattened. Because of the shape of the groove 41 of the frame 40, the angle formed between the top surface and the side surface of the lower conductor layer 10 is made an obtuse angle in the corner portion formed by the top surface and the side surface of the lower conductor layer 10.

Figure 18:
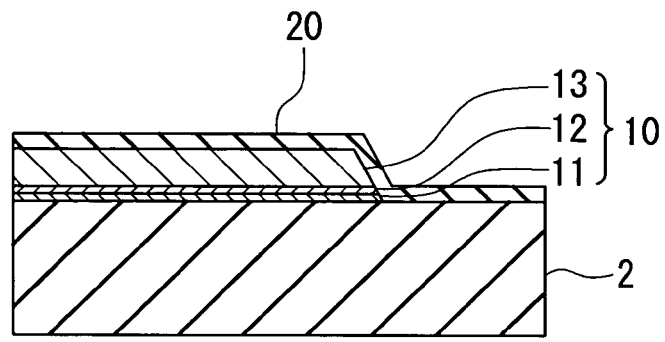
FIG. 18 is a cross-sectional view illustrating a step that follows the step of FIG. 17.

Next, as shown in FIG. 18, the dielectric film 20 is formed by sputtering, for example, to cover the top and side surfaces of the lower conductor layer 10 and the top surface of the substrate 2. The thickness of the dielectric film 20 is 0.1 μm, for example.

Figure 19:
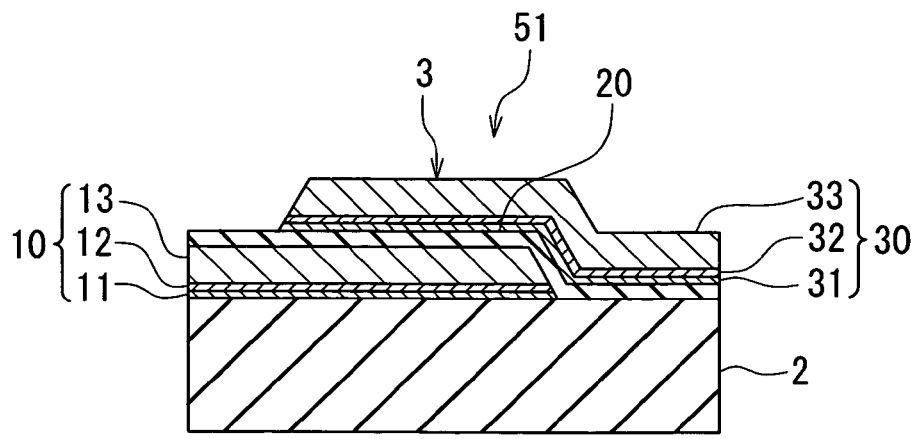
FIG. 19 is a cross-sectional view illustrating a step that follows the step of FIG. 18.

Next, as shown in FIG. 19, the upper conductor layer 30 is formed in a region that is on the dielectric film 20 and that is opposed to the top surface and the side surface of the lower conductor layer 10 and the top surface of the substrate 2 with the dielectric film 20 disposed in between. A method of forming the upper conductor layer 30 is the same as that of the lower conductor layer 10 except the flattening processing. That is, the electrode films 31 and 32 are first formed in this order on the dielectric film 20. The materials and thicknesses of the electrode films 31 and 32 are the same as those of the electrode films 11 and 12. Next, a positive photoresist layer having a thickness of 8 μm, for example, is formed on the electrode film 32. Next, the positive photoresist layer is patterned by photolithography to form a frame not shown. The frame has a groove having a shape corresponding to the shape of the upper conductor layer 30 to be formed. Next, the plating film 33 is formed in the groove by electroplating using the electrode films 31 and 32 as electrodes. The material of the plating film 33 is Cu, for example. The thickness of the plating film 33 is 8 μm, for example. Next, the frame is removed. Next, the electrode films 31 and 32 except portions thereof located below the plating film 33 are removed by dry etching or wet etching. As a result, the upper conductor layer 30 is formed of the remaining electrode films 31 and 32 and the plating film 33.

In the embodiment, when seen from above the upper conductor layer 30, the periphery of the top surface of the lower electrode portion 10a is located inside the periphery of the bottom surface of the upper conductor layer 30 without touching the periphery of the bottom surface of the upper conductor layer 30. As a result, even if there is a certain variation in relative positional relationship between the lower electrode portion 10a and the upper conductor layer 30, the area of the region in which the lower electrode portion 10a and the upper conductor layer 30 are opposed to each other with the dielectric film 20 disposed in between will not change. To be specific, the area of the region in which the lower electrode portion 10a and the upper conductor layer 30 are opposed to each other with the dielectric film 20 disposed in between is equal to the area of the top surface of the lower electrode portion 10a until the periphery of the top surface of the lower electrode portion 10a touches the periphery of the bottom surface of the upper conductor layer 30. Therefore, until the periphery of the top surface of the lower electrode portion 10a touches the periphery of the bottom surface of the upper conductor layer 30, the area of the region in which the lower electrode portion 10a and the upper conductor layer 30 are opposed to each other with the dielectric film 20 disposed in between will not change even if there is a variation in relative positional relationship between the lower electrode portion 10a and the upper conductor layer 30. The area of the region in which the lower electrode portion 10a and the upper conductor layer 30 are opposed to each other with the dielectric film 20 disposed in between is one of the parameters for determining the capacitance of the capacitor 3. Because of the forgoing, according to the embodiment, it is possible to prevent a change in capacitance of the capacitor 3 resulting from a variation in relative positional relationship between the lower conductor layer 10 and the upper conductor layer 30.

In the embodiment, until the periphery of the top surface of the lower electrode portion 10a touches the periphery of the bottom surface of the upper conductor layer 30, the upper conductor layer 30 is constantly opposed to the corner portion with the dielectric film 20 disposed in between, the corner portion being formed by the top surface and the side surface of the lower electrode portion 10a, even if there is a variation in relative positional relationship between the lower electrode portion 10a and the upper conductor layer 30. That is, such uncertainty is impossible that it depends whether the upper conductor layer 30 is opposed or not opposed to the corner portion of the lower electrode portion 10a with the dielectric film 20 disposed in between. As a result, according to the embodiment, it is possible to prevent changes in characteristics of the capacitor 3 resulting from a variation in relative positional relationship between the lower conductor layer 10 and the upper conductor layer 30.

The foregoing features of the embodiment make it possible to suppress variations in characteristics of the capacitor 3 resulting from a variation in relative positional relationship between the lower conductor layer 10 and the upper conductor layer 30.

According to the embodiment, the angle formed between the top surface and the side surface of the lower conductor layer 10 is an obtuse angle in the corner portion formed by the top surface and the side surface of the lower conductor layer 10. As a result, according to the embodiment, it is possible to prevent a reduction in thickness of the dielectric film 20 in a neighborhood of the corner portion of the lower conductor layer 10. It is thereby possible to suppress a short-circuit failure and a reduction in withstand voltage of the capacitor 3 resulting from the structure in which the upper conductor layer 30 is opposed to the corner portion of the lower conductor layer 10 with the dielectric film 20 disposed in between.

The remainder of configuration, function and effects of the second embodiment are similar to those of the first embodiment.

The present invention is not limited to the foregoing embodiments but may be practiced in still other ways. For example, in the thin-film device of the invention, a protection film may be provided on the upper conductor layer 30, or the upper conductor layer 30 may be exposed. Furthermore, one or more additional layers may be provided above the upper conductor layer 30.

In the invention, flattening processing by polishing or by forming a flattening film may be performed on the top surface of the upper conductor layer 30 as in the case of the top surface of the lower conductor layer 10, and then another dielectric film and conductor layer may be formed in this order on the top surface of the upper conductor layer 30 or the top surface of the flattening film. Furthermore, in such a way, flattening processing on the top surface of the conductor layer and formation of another dielectric film and conductor layer may be repeated. As a result, it is possible to form a capacitor having a configuration in which conductor layers and dielectric films are alternately stacked in a total of five or more layers.

The thin-film device of the invention may include elements other than a capacitor. Such elements may be passive elements such as inductors or active elements such as transistors. Such elements may also be lumped-constant elements or distributed-constant elements.

The thin-film device of the invention may comprise terminals disposed on sides, the bottom surface or the top surface. The thin-film device of the invention may comprise through holes for connecting a plurality of conductor layers. The thin-film device of the invention may comprise conductor layers for wiring for connecting the lower conductor layer 10 or the upper conductor layer 30 to terminals or other elements. Alternatively, portions of the lower conductor layer 10 or the upper conductor layer 30 may also serve as the terminals, or the lower conductor layer 10 or the upper conductor layer 30 may be connected to the terminals via through holes.

If the thin-film device of the invention incorporates elements other than the capacitor, the thin-film device may be used as a variety of circuit components including a capacitor, such as LC circuit components, various filters including low-pass filters, high-pass filters and band-pass filters, diplexers, and duplexers.

The thin-film device of the invention is utilized for a mobile communications apparatus such as a cellular phone and a communications apparatus for a wireless LAN, for example.

Obviously many modifications and variations of the present invention are possible in the light of the above teachings. It is therefore to be understood that within the scope of the appended claims the invention may be practiced otherwise than as specifically described.

What is claimed is:

1. A thin-film device comprising a capacitor, wherein:
   the capacitor incorporates: a lower conductor layer; a dielectric film a portion of which is disposed on the lower conductor layer; and an upper conductor layer disposed on the dielectric film;
   the lower conductor layer incorporates a lower electrode portion that functions as an electrode of the capacitor;
   the lower electrode portion has a top surface, a side surface, and a corner portion formed by the top surface and the side surface;
   the entire top surface of the lower electrode portion is flattened;
   in the corner portion, an angle formed between the top surface of the lower electrode portion and the side surface of the lower electrode portion is an obtuse angle;
   the dielectric film has a thickness smaller than a thickness of the lower electrode portion, and touches the top surface, the side surface and the corner portion of the lower electrode portion;
   the upper conductor layer has a bottom surface opposed to the entire top surface, the entire side surface and the entire corner portion of the lower electrode portion with the dielectric film disposed in between;
   when seen from above the upper conductor layer, a periphery of the top surface of the lower electrode portion is located inside a periphery of the bottom surface of the upper conductor layer without overlapping any portion of the periphery of the bottom surface of the upper conductor layer;
   each of the upper conductor layer and the lower conductor layer has a thickness within a range of 5 to 10 μm, inclusive, throughout the upper conductor layer and the lower conductor layer; and
   the upper conductor layer has, when viewed from above, a portion that is located outside the entire corner portion of the lower electrode portion, the portion that is located outside the entire corner portion is parallel to the side surface of the lower electrode portion and has a thickness within the range of 5 to 10 μm, inclusive, throughout the portion that is located outside the entire corner portion.

2. The thin-film device according to claim 1, wherein the thickness of the dielectric film falls within a range of 0.02 to 1 μm inclusive.

3. A method of manufacturing a thin-film device comprising a capacitor, wherein: the capacitor incorporates a lower conductor layer, a dielectric film a portion of which is disposed on the lower conductor layer, and an upper conductor layer disposed on the dielectric film; the lower conductor layer incorporates a lower electrode portion that functions as an electrode of the capacitor; the lower electrode portion has a top surface, a side surface, and a corner portion formed by the top surface and the side surface; the entire top surface of the lower electrode portion is flattened; the dielectric film has a thickness smaller than a thickness of the lower electrode portion, and touches the top surface, the side surface and the corner portion of the lower electrode portion; the upper conductor layer has a bottom surface opposed to the entire top surface, the entire side surface and the entire corner portion of the lower electrode portion with the dielectric film disposed in between; and, when seen from above the upper conductor layer, a periphery of the top surface of the lower electrode portion is located inside a periphery of the bottom surface of the upper conductor layer without overlapping any portion of the periphery of the bottom surface of the upper conductor layer, each of the upper conductor layer and the lower conductor layer has a thickness within a range of 5 to 10 μm, inclusive, throughout the upper conductor layer and the lower conductor layer; and the upper conductor layer has, when viewed from above, a portion that is located outside the entire corner portion of the lower electrode portion, the portion that is located outside the entire corner portion is parallel to the side surface of the lower electrode portion and has a thickness within the range of 5 to 10 μm, inclusive, throughout the portion that is located outside the entire corner portion, the method comprising the steps of:

forming the lower conductor layer so that, in the corner portion of the lower electrode portion, an angle formed between the top surface of the lower electrode portion and the side surface of the lower electrode portion is an obtuse angle;

forming the dielectric film; and forming the upper conductor layer.

4. The method according to claim 3, wherein the thickness of the dielectric film falls within a range of 0.02 to 1 μm inclusive.

* * * * *